(12) United States Patent
Miki et al.

(10) Patent No.: US 7,032,066 B2
(45) Date of Patent: Apr. 18, 2006

(54) SEMICONDUCTOR MEMORY UNIT

(75) Inventors: Takeo Miki, Tokyo (JP); Mikio Asakura, Tokyo (JP); Takeshi Hamamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 881 days.

(21) Appl. No.: 09/956,346

(22) Filed: Sep. 20, 2001

(65) Prior Publication Data

US 2003/0056042 A1    Mar. 20, 2003

(51) Int. Cl.
*G11C 7/10* (2006.01)
(52) U.S. Cl. .......................... 711/104; 365/51; 365/233
(58) Field of Classification Search ................ 365/208, 365/114, 174, 189.08, 189.09; 710/100, 710/110, 129
See application file for complete search history.

(56) References Cited

U.S. PATENT DOCUMENTS 6,112,272 A * 8/2000 Gates .......................... 710/110
6,622,194 B1 * 9/2003 Lee ............................. 710/305
6,745,369 B1 * 6/2004 May et al. ...................... 716/1
2002/0012263 A1 * 1/2002 Ohshima et al. ............... 365/51
2003/0147298 A1 * 8/2003 Ooishi et al. ................ 365/233

FOREIGN PATENT DOCUMENTS

JP    5-151776    6/1993

* cited by examiner

*Primary Examiner*—Donald Sparks
*Assistant Examiner*—Jared Rutz
(74) *Attorney, Agent, or Firm*—McDermott Will & Emery LLP

(57) ABSTRACT

In a semiconductor memory unit to which a plurality of different functions can be imparted by merely changing a portion of its production process, the improvement comprises: a plurality of data buses which include first data buses for use only in one of the functions and the remaining data buses for use in the one and the remainder of the functions; wherein when the semiconductor memory unit performs the remainder of the functions, the first data buses are utilized for the semiconductor memory unit.

14 Claims, 6 Drawing Sheets

SEMICONDUCTOR MEMORY UNIT

BACKGROUND OF THE INVENTION

1. Field of the Invention

The present invention relates to wiring of data buses in a semiconductor memory unit.

2. Description of the Prior Art

In recent years, products of two or more types have been produced in one chip by changing a mere portion of a production process, for example, changing wiring at the time of assembly or changing an aluminum step in wafer process. Especially, in case change between a double data rate synchronous DRAM (DDR SDRAM) and a single data rate synchronous DRAM (SDR SDRAM) is effected, data transfer rate of the DDR SDRAM should be twice that of the SDR SDRAM and thus, the number of data buses for data transfer of the DDR SDRAM should be twice that of the SDR SDRAM. Therefore, in the SDR SDRAM, the number of unnecessary ones of the data buses increases.

SUMMARY OF THE INVENTION

Accordingly, an essential object of the present invention is to provide a semiconductor memory unit in which unnecessary data buses are utilized effectively.

In order to accomplish this object of the present invention, the improvement in a semiconductor memory unit to which a plurality of different functions can be imparted by merely changing a portion of its production process, according to the present invention comprises: a plurality of data buses which include first data buses for use only in one of the functions and the remaining data buses for use in the one and the remainder of the functions; wherein when the semiconductor memory unit performs the remainder of the functions, the first data buses are utilized for the semiconductor memory unit.

BRIEF DESCRIPTION OF THE DRAWINGS

This object and features of the present invention will become apparent from the following description taken in conjunction with the preferred embodiment(s) thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
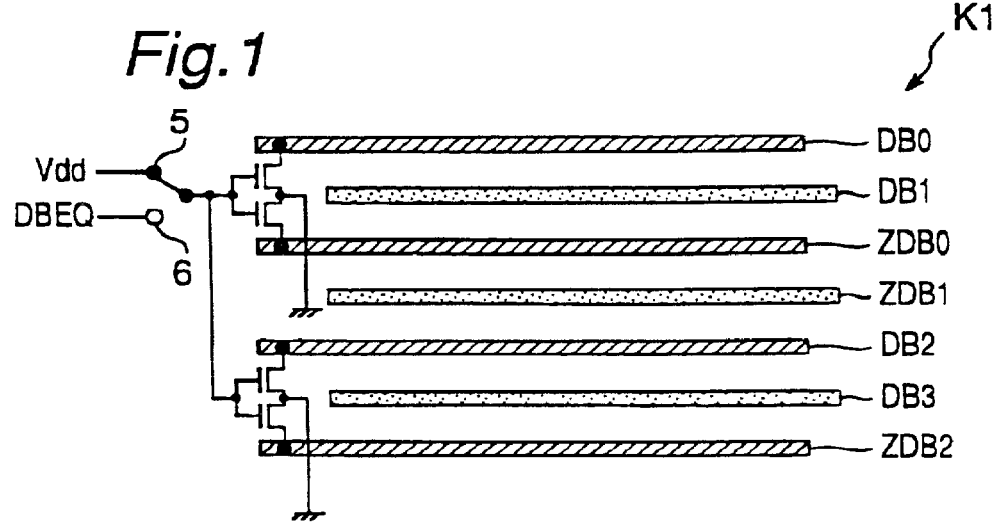
FIG. 1 is a wiring diagram of a semiconductor memory unit according to a first embodiment of the present invention.

FIG. 1 shows a configuration of a semiconductor memory unit K1 according to a first embodiment of the present invention, which functions not only as a double data rate synchronous DRAM (abbreviated as a "DDR SDRAM" or a "DDR", hereinafter) but as a singe data rate synchronous DRAM (abbreviated as a "SDR SDRAM" or a "SDR", hereinafter) by an identical chip having differences in an aluminum step or bonding specification. In the DDR SDRAM, the number of data buses should be twice that of the SDR SDRAM in order to obtain a data transfer rate twice that of the SDR SDRAM.

In the semiconductor memory unit K1, data buses DB1, ZDB1 and DB3 are used in common for the SDR SDRAM and the DDR SDRAM, while data buses DB0, ZDB0, DB2 and ZDB2 are used exclusively for the DDR SDRAM. Namely, the data buses DB0, ZDB0, DB2 and ZDB2 are not used for the SDR SDRAM. In FIG. 1, in order to effectively utilize the data buses DB0, ZDB0, DB2 and ZDB2 unnecessary for the SDR SDRAM, the data buses DB0, ZDB0, DB2 and ZDB2 which are used for the DDR SDRAM but are not used for the SDR RAM are utilized as shielding wires.

The data buses DB0, ZDB0, DB2 and ZDB2 not for use in the SDR SDRAM are preliminarily provided between the data buses DB1, ZDB1 and DB3 for use in both the SDR SDRAM and the DDR SDRAM. An SDR switch 5 for selecting the SDR SDRAM and a DOR switch 6 for selecting the DDR SDRAM are provided in the semiconductor memory unit K1 so as to perform changeover between the SDR SDRAM and the DDR SDRAM and are, respectively, connected to a supply voltage Vdd and a signal line DBEQ. When the semiconductor memory unit K1 functions as the SDR SDRAM by actuating the SDR switch 5, neighboring two of the data buses DB0, ZDB0, DB2 and ZDB2 used exclusively for the DDR SDRAM are necessarily disposed at opposite sides of a corresponding one of the data buses DB1, ZDB1 and DB3 used for both the SDR SDRAM and the DDR SDRAM, so that resistance to noise in the semiconductor memory unit K1 is upgraded, thereby resulting in improvement of performance of the semiconductor memory unit K1. In FIG. 1, voltage of the shielding wires DB0, ZDB0, DB2 and ZDB2 is equalized at ground level but may be an arbitrary value.

(Second Embodiment)

Figure 2:
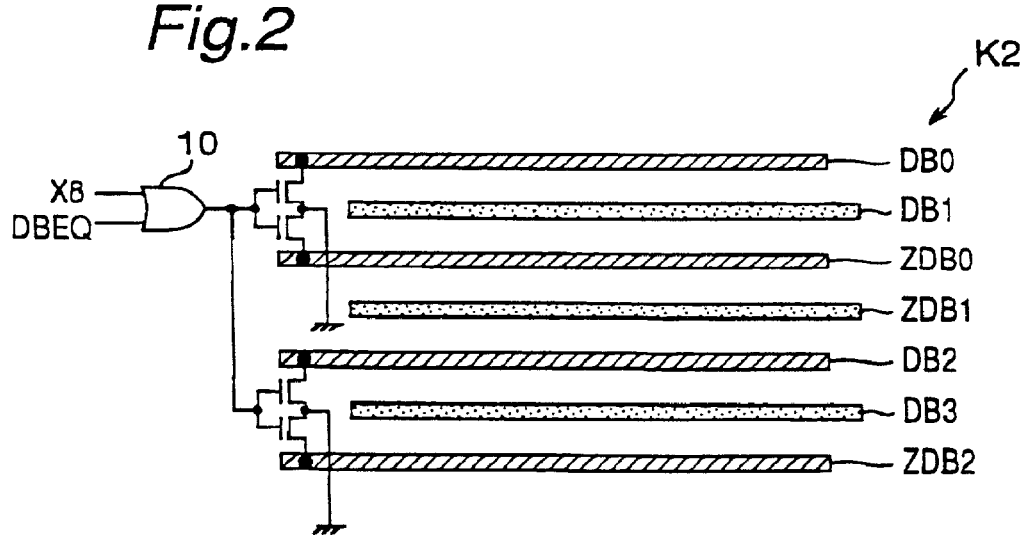
FIG. 2 is a wiring diagram of a semiconductor memory unit according to a second embodiment of the present invention.

FIG. 2 shows a configuration of a semiconductor memory unit K2 according to a second embodiment of the present invention, which can be used for not only a word organization X4 but a word organization X8 by an identical chip.

In case a plurality of word organizations, for example, X4 and X8 are obtained in the single chip especially by difference in boding at an assembly step, the number of data buses necessary for data transfer should be designed in accordance with the largest word organization, i.e., the word organization X8.

In the semiconductor memory unit K2, data buses DB1, ZDB1 and DB3 are used in common for the word organization X4 and the word organization X8, while data buses DB0, ZDB0, DB2 and ZDB2 are used exclusively for the word organization X8. As shown in FIG. 2, the data buses DB0, ZDB0, DB2 and ZDB2 not for use in the word organization X4 are provided between the data buses DB1, ZDB1 and DB3 for use in both the word organization X4 and the word organization X8. Thus, when the semiconductor memory unit K2 is used for the word organization X4 by actuating an OR circuit 10, the data buses DB0, ZDB0, DB2 and ZDB2 not for use in the word organization X4 act as shielding wires, so that operational margin of the semiconductor memory unit K2 is increased by upgrading resistance to noise in the semiconductor memory unit K2, thereby resulting in improvement of performance of the semiconductor memory unit K2.

(Third Embodiment)

Figure 3:
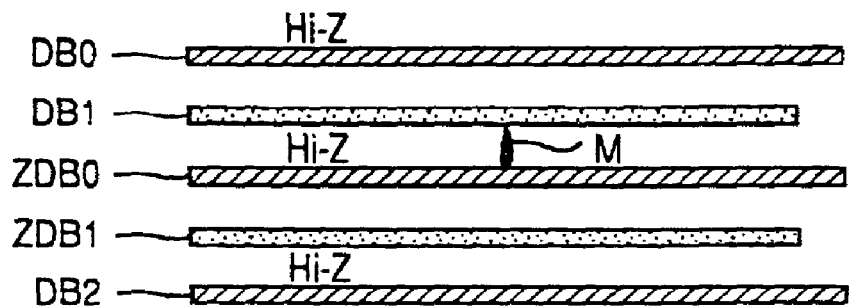
FIG. 3 is a wiring diagram of a semiconductor memory unit according to a third embodiment of the present invention.

FIG. 3 shows a configuration of a semiconductor memory unit K3 according to a third embodiment of the present invention. In the semiconductor memory unit K3, data buses DB1 and ZDB1 are used at all times, while data buses DB0, ZDB0 and DB2 not in use according to its word organizations, its product types, etc. are set in a floating state of their DC level so as to have high impedance. As shown in FIG. 3, the data buses DB0, ZDB0 and DB2 not in use according to its word organizations, its product types, etc. are provided between the data buses DB1 and ZDB1 in use. Therefore, even if the data buses DB1 and DB0 are minutely short-circuited to each other by electrically conductive foreign matter M as shown in FIG. 3, operational margin of the semiconductor memory unit K3 against the short-circuiting is increased, thereby resulting in rise of yield of the semiconductor memory unit K3.

(Fourth Embodiment)

Figure 4:
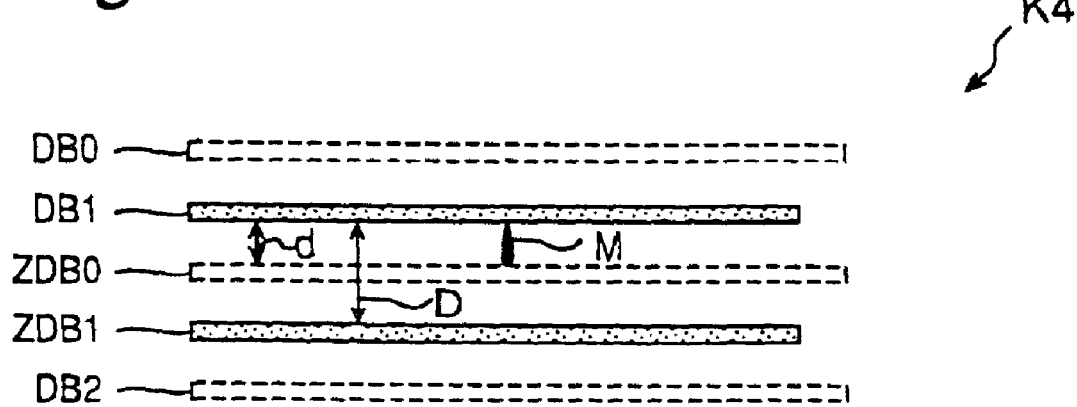
FIG. 4 is a wiring diagram of a semiconductor memory unit according to a fourth embodiment of the present invention.

FIG. 4 shows a configuration of a semiconductor memory unit K4 according to a fourth embodiment of the present invention, in which changeover of product types, for example, the SDR SDRAM and the DDR SDRAM is performed by replacing a mask. In the semiconductor memory unit K4, data buses DB1 and ZDB1 are used at all times, while data buses DB0, ZDB0 and DB2 not in use according to the product types are removed. By removing the data buses DB0, ZDB0 and DB2, yield of the semiconductor memory unit K4 is raised by lessening short-circuiting due to electrically conductive foreign matter M shown in FIG. 4 and the semiconductor memory unit K4 can be operated at high speed by reducing line capacitance between neighboring ones of the data buses to its half upon twofold increase of a distance d therebetween to a distance D.

(Fifth Embodiment)

Figure 5:
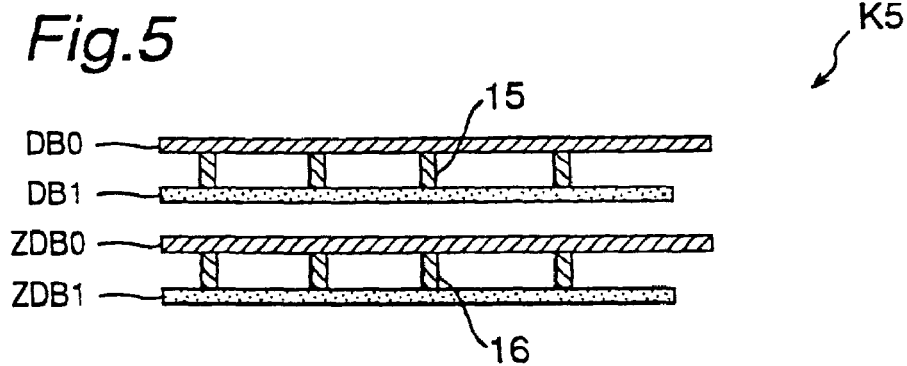
FIG. 5 is a wiring diagram of a semiconductor memory unit according to a fifth embodiment of the present invention.

FIG. 5 shows a configuration of a semiconductor memory unit K5 according to a fifth embodiment of the present invention. In the semiconductor memory unit K5, data buses DB1 and ZDB1 are used at all times, while data buses DB0 and ZDB0 not in use according to its word organizations, its product types. etc. are set in a floating state of their DC level so as to have high impedance. The data buses DB0 and ZDB0 hot in use are, respectively, short-circuited to the data buses DB1 and ZDB1 in use by conductors 15 and 16 so as to lower resistance of the data buses DB1 and ZDB1 in use such that time constant of the data buses DB1 and ZDB1 in use is reduced. At this time, since each of line capacitance between the data buses DB0 and DB1 short-circuited to each other and line capacitance between the data buses ZDB0 and ZDB1 short-circuited to each other is not twice that between the data buses DB1 and ZDB1 in use, the semiconductor memory unit K5 can be operated at high speed.

(Sixth Embodiment)

Figure 6:
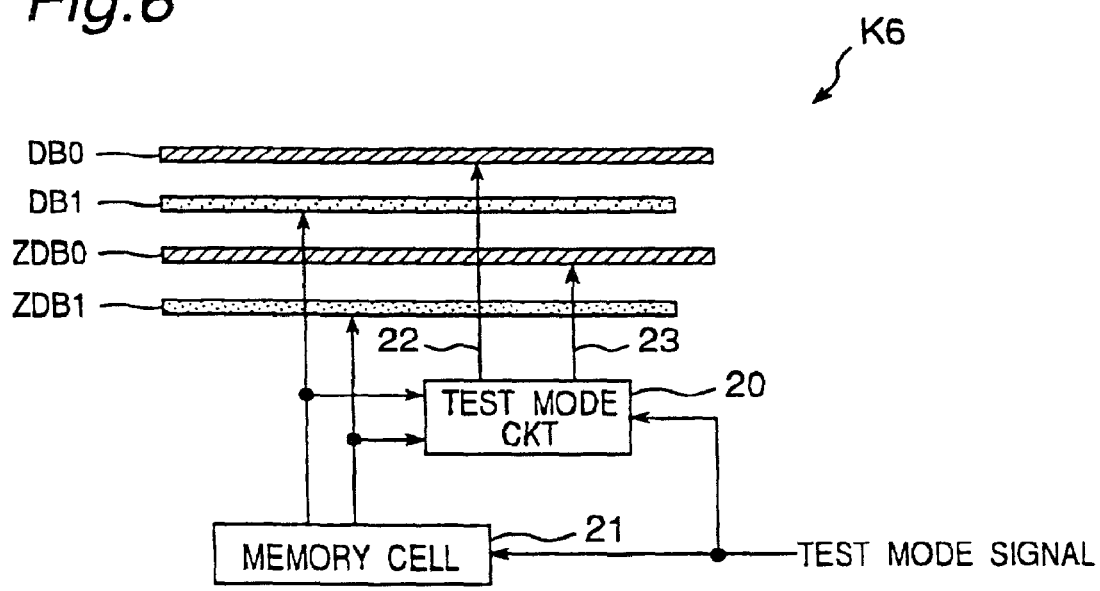
FIG. 6 is a wiring diagram of a semiconductor memory unit according to a sixth embodiment of the present invention.

FIG. 6 shows a configuratior of a semiconductor memory unit K6 according to a sixth embodiment of the present invention, which functions not only as a DDR SDRAM but as an SDR SDRAM. In the semiconductor memory unit K6, data buses DB1 and ZDB1 are normally used for the SDR SDRAM, while data buses DB0 and ZDB1 are used exclusively for the DDR SDRAM. The data buses DB0 and ZDB1 are also used at the time of a test mode of the SDR SDRAM. A test mode circuit 20 and a memory cell 21 are provided in the semiconductor memory unit K6 so as to receive a test mode signal. Meanwhile, a line 22 extends from the test mode circuit 20 to the data bus DB0, while a line 23 extends from the test mode circuit 20 to the data bus ZDB0.

By the above described configuration of the semiconductor memory unit K6, wire capacitance of the lines 22 and 23 and load in the test mode circuit 20 can be lessened. Thus, operational margin of the semiconductor memory unit K6 can be increased and the semiconductor memory unit K6 can be operated at high speed by reducing its time constant.

In this embodiment, the semiconductor memory unit K6 is applied to product types such as the SDR SDRAM and the DDR SDRAM but may also be applied to any similar criteria such as word organizations.

(Seventh Embodiment)

Figure 7:
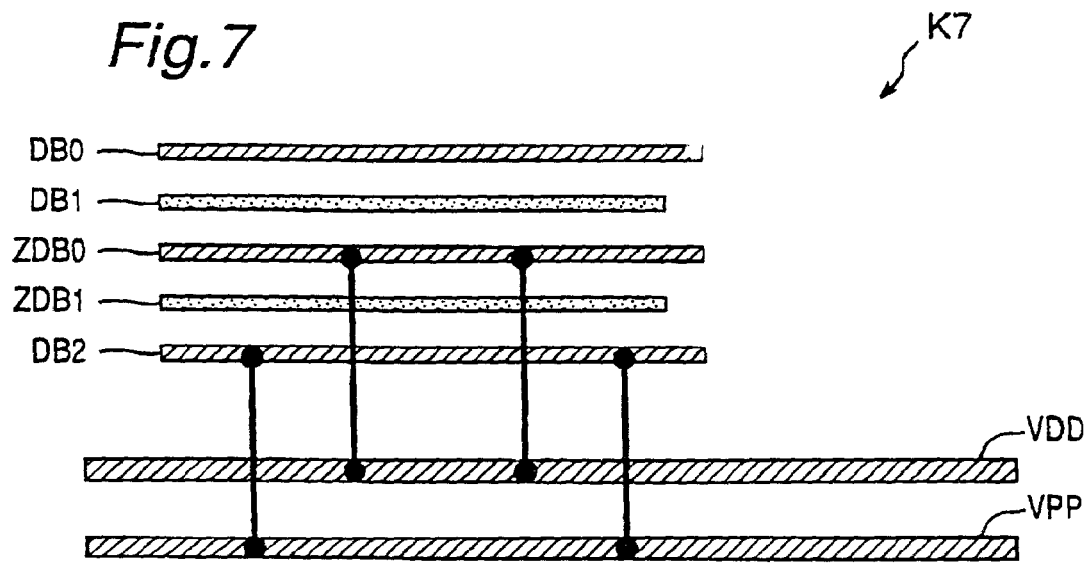
FIG. 7 is a wiring diagram of a semiconductor memory unit according to a seventh embodiment of the present invention.

FIG. 7 shows a configuration of a semiconductor memory unit K7 according to a seventh embodiment of the present invention. In the semiconductor memory unit K7, data buses DB1 and ZDB1 are used for data transfer at all times, while data buses DB0, ZDB0 and DB2 are not used for data transfer. In FIG. 7, the data buses ZDB0 and DB2 are utilized as power lines VDD and VPP, respectively.

Generally, since a data bus is laid from one end to the other end of a chip, the data bus is usually made of aluminum so as to reduce its time constant. However, as a more word organization is employed, the number of the data buses increases and thus, a wiring area of the data buses increases. Hence, such a case may happen in which the data buses are laid by reducing a wiring area of the power lines. In this case, power supply capability may deteriorate due to rise of resistance of the power lines. In order to avoid such a risk, some of the data buses are not used according to its word organizations such as X4, X8 and X16 and its product types such as the DDR SDRAM and the SDR SDRAM Therefore, when the data buses not in use are utilized as the power lines, resistance of the power lines is lowered and thus, the power lines are strengthened. In addition, the data buses not in use, which act as the power lines, act also as shielding wires.

(Eighth Embodiment)

Figure 8:
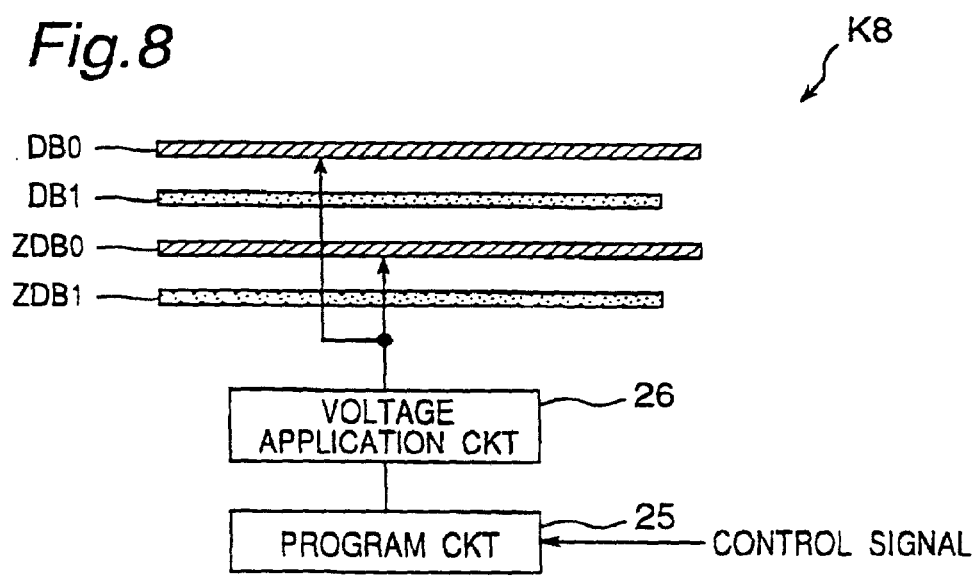
FIG. 8 is a wiring diagram of a semiconductor memory unit according to an eighth embodiment of the present invention.

FIG. 8 shows a configuration of a semiconductor memory unit K8 according to an eighth embodiment of the present invention. In the semiconductor memory unit K8, data buses DB1 and ZDB1 are used at all times, while data buses DB0 and ZDB0 are not used according to its word organizations and its product types. The semiconductor memory unit K8 represents a first example in which an arbitrary voltage is applied to the data buses DB0 and ZDB0 not in use according to its word organizations and its product types. To this end, a program circuit 25 for receiving a control signal and a voltage application circuit 26 are provided in the semiconductor memory unit KB. In response to a command from the program circuit 25, the voltage application circuit 26 applies the arbitrary voltage to the data buses DB0 and ZDB0.

In case, for example, the data buses DB0 and DB1 are short-circuited to each other by a foreign matter present therebetween during production of the semiconductor memory unit K8, a test step can be speeded up by applying a high voltage to the data buses DB0 and ZDB0.

Meanwhile, if a voltage is adapted to be applied to the data buses DB0 and ZDB0 at all times, the data buses DB0 and ZDB0 can be strengthened as the power lines of the seventh embodiment.

(Ninth Embodiment)

Figure 9:
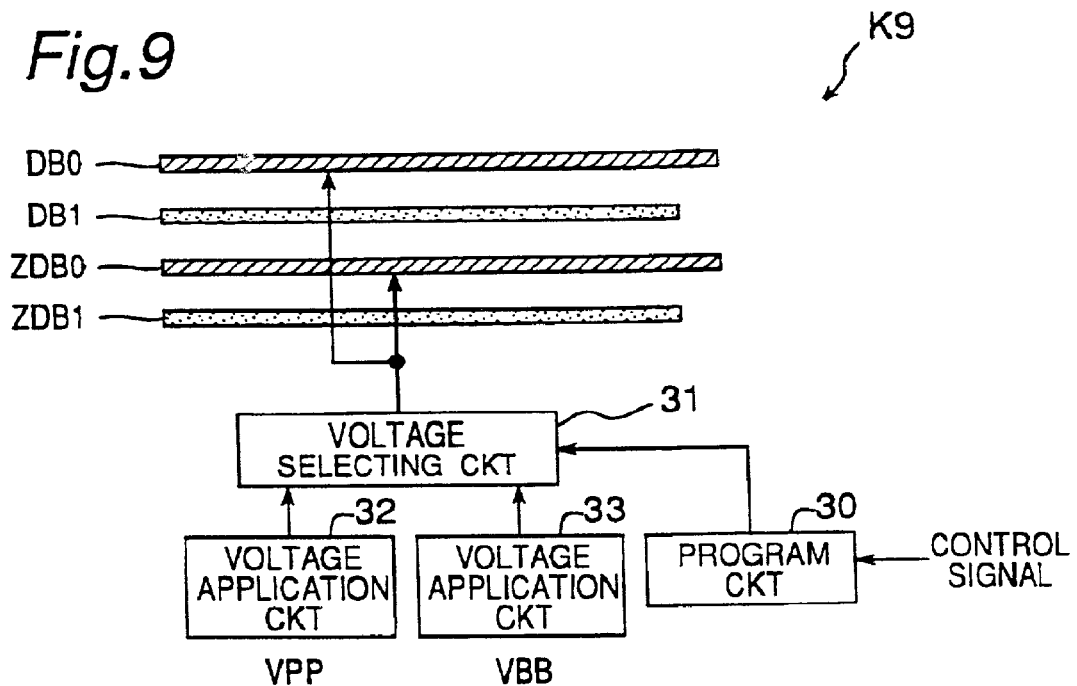
FIG. 9 is a wiring diagram of a semiconductor memory unit according to a ninth embodiment of the present invention.

FIG. 9 shows a configuration of a semiconductor memory unit K9 according to a ninth embodiment of the present invention. In the semiconductor memory unit K9, data buses DB1 and ZDB1 are used at all times, while data buses DB0 and ZDB0 are not used according to its word organizations and its product types. The semiconductor memory unit K9 represents a second example in which an arbitrary voltage is applied to the data buses DB0 and ZDB0 not in use according to its word organizations and its product types To this end, a program circuit 30 for receiving a control signal, a voltage selecting circuit 31, a first voltage application circuit 32 having a voltage VPP and a second voltage application circuit 33 having a voltage VBB are provided in the semiconductor memory unit K9. In response to a command from the program circuit 30, the voltage selecting circuit 31 selects the arbitrary voltage from a plurality of the voltage VPP of the first voltage application circuit 32 and the voltage VBB of the second voltage application circuit 33 so as to apply the arbitrary voltage to the data buses DB0 and ZDB0.

In the semiconductor memory unit K8 of the eighth embodiment, the voltage is applied to the data buses DB0 and ZDB0 from only the single voltage application circuit 26. However, in the semiconductor memory unit K9, the voltage selecting circuit 31 has a function of selecting from a plurality of the voltages, the voltage to be applied to the data buses DB0 and ZDB0. If this function of the voltage selecting circuit 31 is utilized in the semiconductor memory unit K9 including a DRAM having a plurality of power circuits in a chip, for example, an external voltage may be boosted to the voltage VPP and the voltage VBB equal to or less than 0 V is generated in the DRAM. Therefore, by utilizing the function of the voltage selecting circuit 31, it is also possible to strengthen a power line and speed up a test step.

(Tenth Embodiment)

Figure 10:
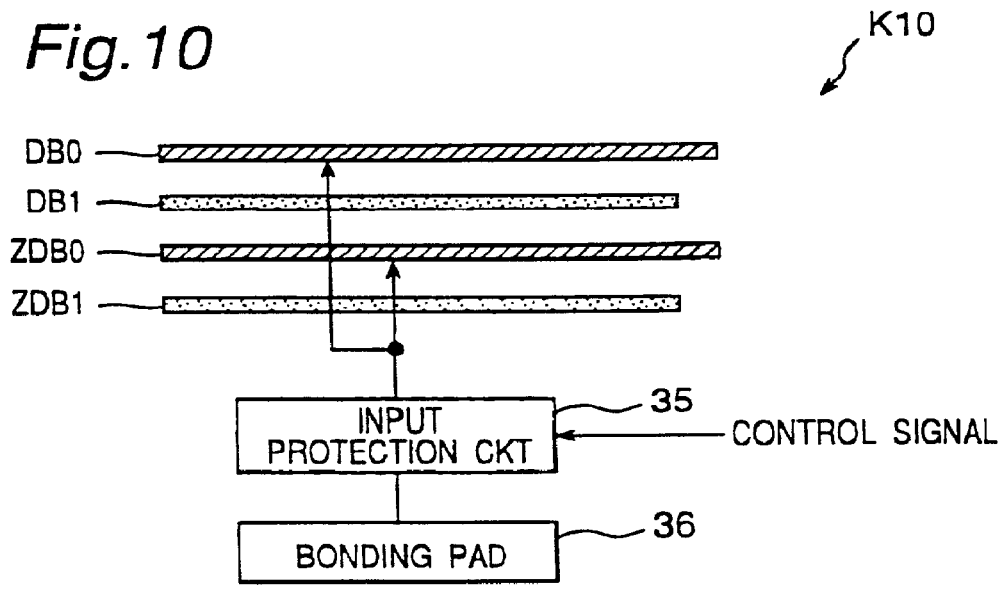
FIG. 10 is a wiring diagram of a semiconductor memory unit according to a tenth embodiment of the present invention.

FIG. 10 shows a configuration of a semiconductor memory unit K10 according to a tenth embodiment of the present invention. In the semiconductor memory unit K10, data buses DB1 and ZDB1 are used at all times, while data buses DB0 and ZDB0 are not used according to its word organizations and its product types. The semiconductor memory unit K9 represents a third example in which an arbitrary voltage is applied to the data buses DB0 and ZDB0 not in use according to its word organizations and its product types. To this end, an input protection circuit 35 is provided in the semiconductor memory unit K10. In response to a control signal, the input protection circuit 35 applies a voltage directly from a bonding pad 36 to the data buses DB0 and ZDB0 The bonding pad 36 may be used only during a wafer test step or only for the DDR SDRAM and is connected to the data buses DB0 and ZDB0 beforehand.

In the semiconductor memory unit K10, the test step can be speeded up.

(Eleventh Embodiment)

Figure 11:
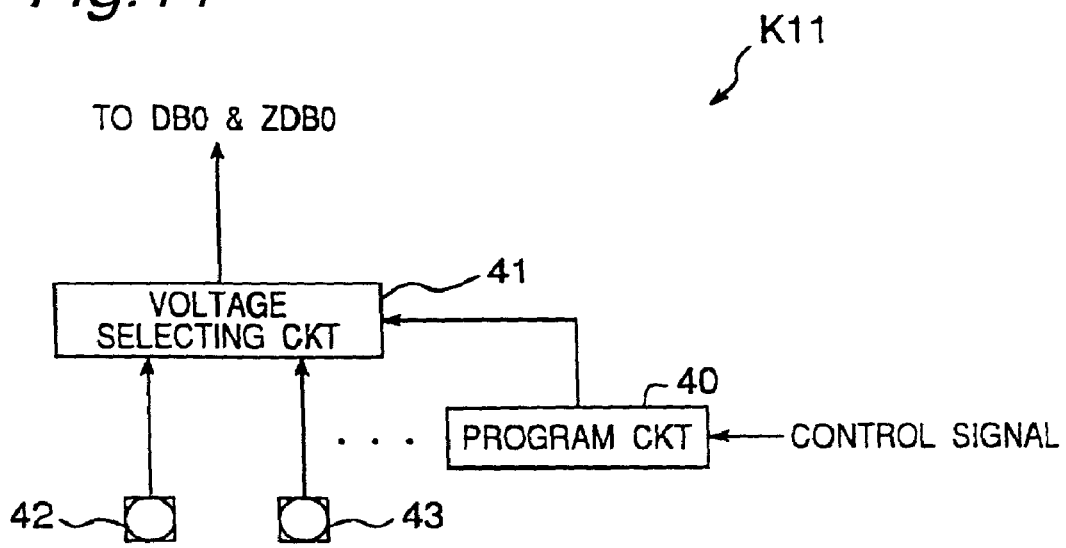
FIG. 11 is a wiring diagram of a semiconductor memory unit according to an eleventh embodiment of the present invention.

FIG. 11 shows a configuration of a semiconductor memory unit K11 according to an eleventh embodiment of the present invention. In the semiconductor memory unit K11, a program circuit 40 for receiving a control signal, a voltage selecting circuit 41 and a plurality of bonding pads 42, 43, etc. are provided in place of the input protection circuit 35 and the bonding pad 36 in the semiconductor memory unit K10 such that a voltage to be applied to the data buses DB0 and ZDB0 is selected from a plurality of the bonding pads 42, 43, etc. by the voltage selecting circuit 41 in response to a command from the program circuit 40.

In the semiconductor memory unit K11, a test step can be speeded up.

(Twelfth Embodiment)

Figure 12:
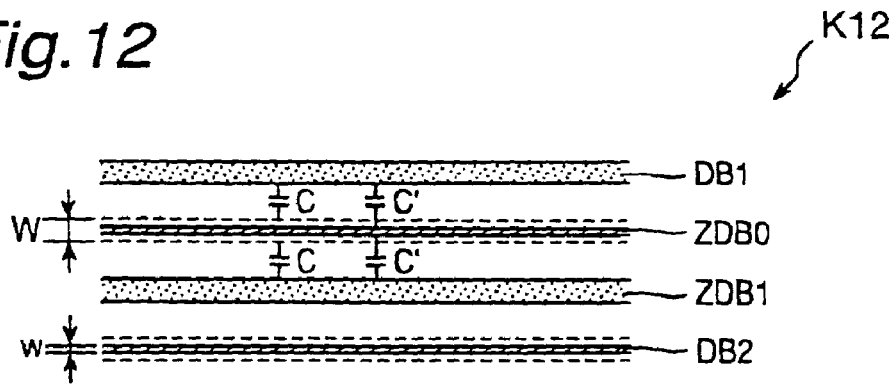
FIG. 12 is a wiring diagram of a semiconductor memory unit according to a twelfth embodiment of the present invention.

FIG. 12 shows a configuration of a semiconductor memory unit K12 according to a twelfth embodiment of the present invention. In the semiconductor memory unit K12, data buses DB1 and ZDB1 are used at all times, while data buses ZDB0 and DB2 are not used according to its word organizations and its product types. Since a line width W of the data buses ZDB0 and DB2 not in use according to its word organizations and its product types is reduced to a value w, a line capacitance C between neighboring ones of the data buses is reduced to a value C', so that the semiconductor memory unit K12 can be operated at high speed while shielding function of the data buses ZDB0 and DB2 not in use is being maintained.

As is clear from the foregoing description, such remarkable effects can be gained in the present invention that resistance to noise in the semiconductor memory unit is upgraded, yield of the semiconductor memory unit is raised, the semiconductor memory unit can be operated at high speed, the power lines are strengthened and the test step can be speeded up.

What is claimed is:

1. In a semiconductor memory unit to which a plurality of different functions can be imparted by merely changing a portion of its production process, the improvement comprising:
  a plurality of data buses which include first data buses for use only in one of the functions and the remaining data buses for use in the one and the remainder of the functions;
  wherein when the semiconductor memory unit performs the remainder of the functions, the first data buses are utilized for the semiconductor memory unit.

2. A semiconductor memory unit according to claim 1, wherein the one and the remainder of the functions are a double data rate synchronous DRAM (DDR SDRAM) and a single data rate synchronous DRAM (SDR SDRAM), respectively;
 wherein when the semiconductor memory unit functions as the SDR SDRAM, the first data buses are utilized as shielding wires by fixing a DC level of the first data buses.

3. A semiconductor memory unit according to claim 1, wherein the one and the remainder of the functions are a first word organization and a second word organization smaller than the first word organization, respectively;
 wherein when the semiconductor memory unit functions as the second organization, the first data buses are utilized as shielding wires by fixing a DC level of the first data buses.

4. A semiconductor memory unit according to claim 1, wherein when the semiconductor memory unit performs the remainder of the functions, a DC level of the first data buses is set in a floating state.

5. A semiconductor memory unit according to claim 1, wherein when the semiconductor memory unit performs the remainder of the functions, the first data buses are removed.

6. A semiconductor memory unit according to claim 1, wherein when the semiconductor memory unit performs the remainder of the functions, the first data buses are short-circuited to the remaining data buses, respectively.

7. A semiconductor memory unit according to claim 1, wherein the first data buses are utilized at the time of a test mode of the remainder of the functions.

8. A semiconductor memory unit according to claim 1, wherein the one and the remainder of the functions are a double data rate synchronous DRAM (DDR SDRAM) and a single data rate synchronous DRAM (SDR SDRAM), respectively;
 wherein the first data buses are utilized at the time of a test mode of the SDR SDRAM.

9. A semiconductor memory unit according to claim 1, wherein when the semiconductor memory unit performs the remainder of the functions, the first data buses are utilized as power lines.

10. A semiconductor memory unit according to claim 1, wherein when the semiconductor memory unit performs the remainder of the functions, the first data buses are subjected to an arbitrary voltage.

11. A semiconductor memory unit according to claim 10, wherein the arbitrary voltage is selected from a plurality of voltage application circuits.

12. A semiconductor memory unit according to claim 10, wherein the arbitrary voltage is applied from a bonding pad to the first data buses.

13. A semiconductor memory unit according to claim 12, wherein the arbitrary voltage is selected from a plurality of bonding pads.

14. A semiconductor memory unit according to claim 1, wherein when the semiconductor memory unit performs the remainder of the functions, a line width of the first data buses is made smaller than that of the remaining data buses.

* * * * *